US008525102B2

(12) United States Patent
Augustyniak et al.

(10) Patent No.: US 8,525,102 B2
(45) Date of Patent: ***Sep. 3, 2013

(54) OPTICAL ENCODING SYSTEM AND OPTICAL ENCODER HAVING AN ARRAY OF INCREMENTAL PHOTODIODES AND AN INDEX PHOTODIODE FOR USE IN AN OPTICAL ENCODING SYSTEM

(75) Inventors: Marcin Augustyniak, Regensburg (DE); Weng Fei Wong, Penang (MY); Cheng Kwong Cheang, Penang (MY)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 0 days.

This patent is subject to a terminal disclaimer.

(21) Appl. No.: 13/027,902

(22) Filed: Feb. 15, 2011

(65) Prior Publication Data

US 2012/0205528 A1    Aug. 16, 2012

(51) Int. Cl.
*G01D 5/34* (2006.01)
(52) U.S. Cl.
USPC .................................. 250/231.13; 250/231.14
(58) Field of Classification Search
USPC ................... 250/231.13–231.18, 239, 214 R, 250/221; 341/8, 11, 13
See application file for complete search history.

(56) References Cited

U.S. PATENT DOCUMENTS

| | | | |
|---|---|---|---|
| 4,451,731 A | 5/1984 | Leonard | |
| 4,691,101 A | 9/1987 | Leonard | |
| 4,866,269 A | 9/1989 | Wlodarczyk et al. | |
| 5,148,020 A * | 9/1992 | Machida | 250/231.16 |
| 5,241,172 A | 8/1993 | Lugaresi | |
| 5,703,356 A | 12/1997 | Bidiville et al. | |
| 6,639,207 B2 | 10/2003 | Yamamoto et al. | |
| 6,906,311 B2 | 6/2005 | Kojima | |
| 7,223,963 B2 | 5/2007 | Okada et al. | |
| 7,276,687 B2 | 10/2007 | Okada | |
| 7,394,061 B2 * | 7/2008 | Bin Saidan et al. | 250/231.13 |
| 7,400,269 B2 | 7/2008 | Wong et al. | |
| 7,619,210 B2 | 11/2009 | Wong et al. | |
| 2002/0180691 A1 | 12/2002 | Wong et al. | |
| 2005/0088667 A1 | 4/2005 | Yeo | |
| 2005/0133705 A1 | 6/2005 | Hare et al. | |
| 2005/0236560 A1 | 10/2005 | Ch'ng et al. | |
| 2006/0192764 A1 | 8/2006 | Siddiqui | |

FOREIGN PATENT DOCUMENTS

JP    2006/170788    6/2006

* cited by examiner

*Primary Examiner* — Que T Le

(57) ABSTRACT

An optical encoder is disclosed. Specifically, a three-channel encoder is disclosed which utilizes a single track for all three channels. An index channel is provided on the same optical track as the first and second channels which are used to determine incremental angular position. Thus, a more compact and simple three-channel encoder is provided.

17 Claims, 16 Drawing Sheets

OPTICAL ENCODING SYSTEM AND OPTICAL ENCODER HAVING AN ARRAY OF INCREMENTAL PHOTODIODES AND AN INDEX PHOTODIODE FOR USE IN AN OPTICAL ENCODING SYSTEM

FIELD OF THE DISCLOSURE

The present disclosure is generally directed toward encoders and more specifically toward optical encoders.

BACKGROUND

A rotary encoder, also called a shaft encoder, is an electro-mechanical device that converts the angular position of a shaft or axle to an analog or digital code, making it an angular transducer. Rotary encoders are used in many applications that require precise shaft unlimited rotation—including industrial controls, robotics, special purpose photographic lenses, computer input devices (such as opto-mechanical mice and trackballs), printers, and rotating radar platforms. There are two main types of rotary encoders: absolute and incremental (relative).

An incremental rotary encoder, also known as a quadrature encoder or a relative rotary encoder, traditionally has two outputs called quadrature outputs. These two outputs can be either mechanical or optical. In the optical type, there are traditionally two bar-window coded tracks, while the mechanical type has two contacts that are actuated by cams on the rotating shaft. Optical incremental encoders traditionally employ two outputs called A & B, which are called quadrature outputs, as they are 90 degrees out of phase.

A variation on the incremental encoder is the sinewave encoder. Instead of producing two quadrature square waves, the outputs are quadrature sine waves (a Sine and a Cosine). By performing the arctangent function, arbitrary levels of resolution can be achieved.

A typical two-channel incremental encoder generates at it's output two chains of pulses shifted by 90 degrees. By counting pulses and checking the phase between the pulses (1st channel leading 2nd or vice versa), it is possible to determine the incremental position of the code wheel as well as the speed and direction of rotation. A significant improvement to a two-channel incremental encoder is a three-channel incremental encoder. The extra channel is index: once per revolution a pulse is generated, so absolute angular position might be then calibrated.

The optical system for a two-channel incremental encoder is simplified by the fact that only one track (pattern of bars and windows) on the code wheel is enough. A straightforward implementation of a three-channel encoder would call for a second track on the code wheel indicating index. Unfortunately, introducing the second track complicates and constrains an optical system projecting code wheel pattern on the sensor area. This is a problem especially in a reflective encoder.

BRIEF DESCRIPTION OF THE DRAWINGS

The present disclosure is described in conjunction with the appended figures.

DETAILED DESCRIPTION

The ensuing description provides embodiments only, and is not intended to limit the scope, applicability, or configuration of the claims. Rather, the ensuing description will provide those skilled in the art with an enabling description for implementing the described embodiments. It being understood that various changes may be made in the function and arrangement of elements without departing from the spirit and scope of the appended claims.

Figure 1:
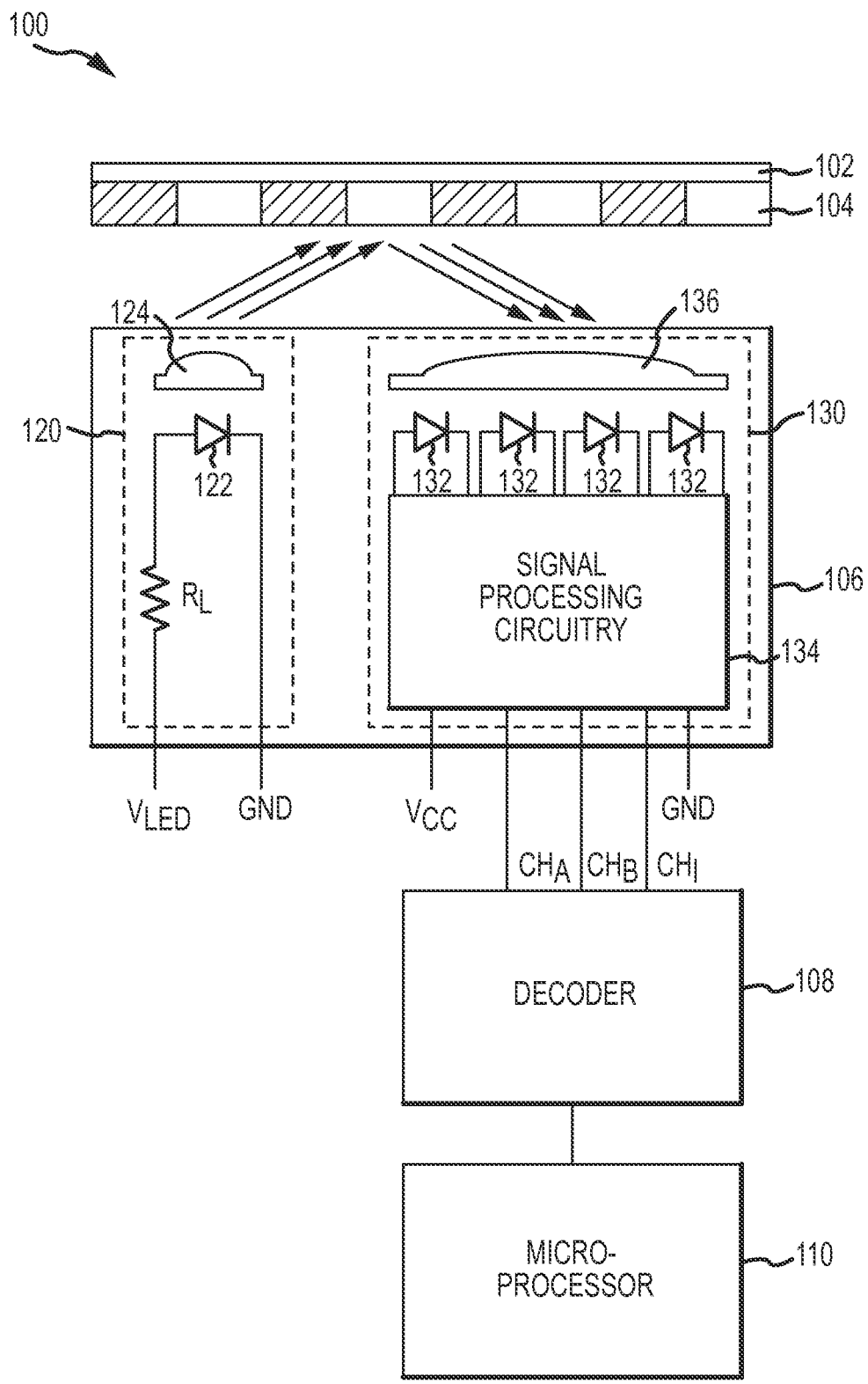
FIG. 1 is block diagram depicting components of a reflective optical encoding system in accordance with embodiments of the present disclosure.

Referring now to FIG. 1, components of a reflective optical encoding system 100 will be described in accordance with embodiments of the present disclosure. The illustrated reflective optical encoding system 100 includes a reflective material 102, a code wheel 104, an encoder 106, a decoder 108, and a micro-processor 110. In one embodiment, the reflective material 102 is a coating or a substrate that is physically coupled to the code wheel 104. In some embodiments, the reflective surface of the reflective material 102 is coupled to the code wheel 104 opposite the encoder 106. In some embodiments, the reflective material 102 is deposited onto the code wheel 104 using any type of known material deposition technique.

Figure 2:
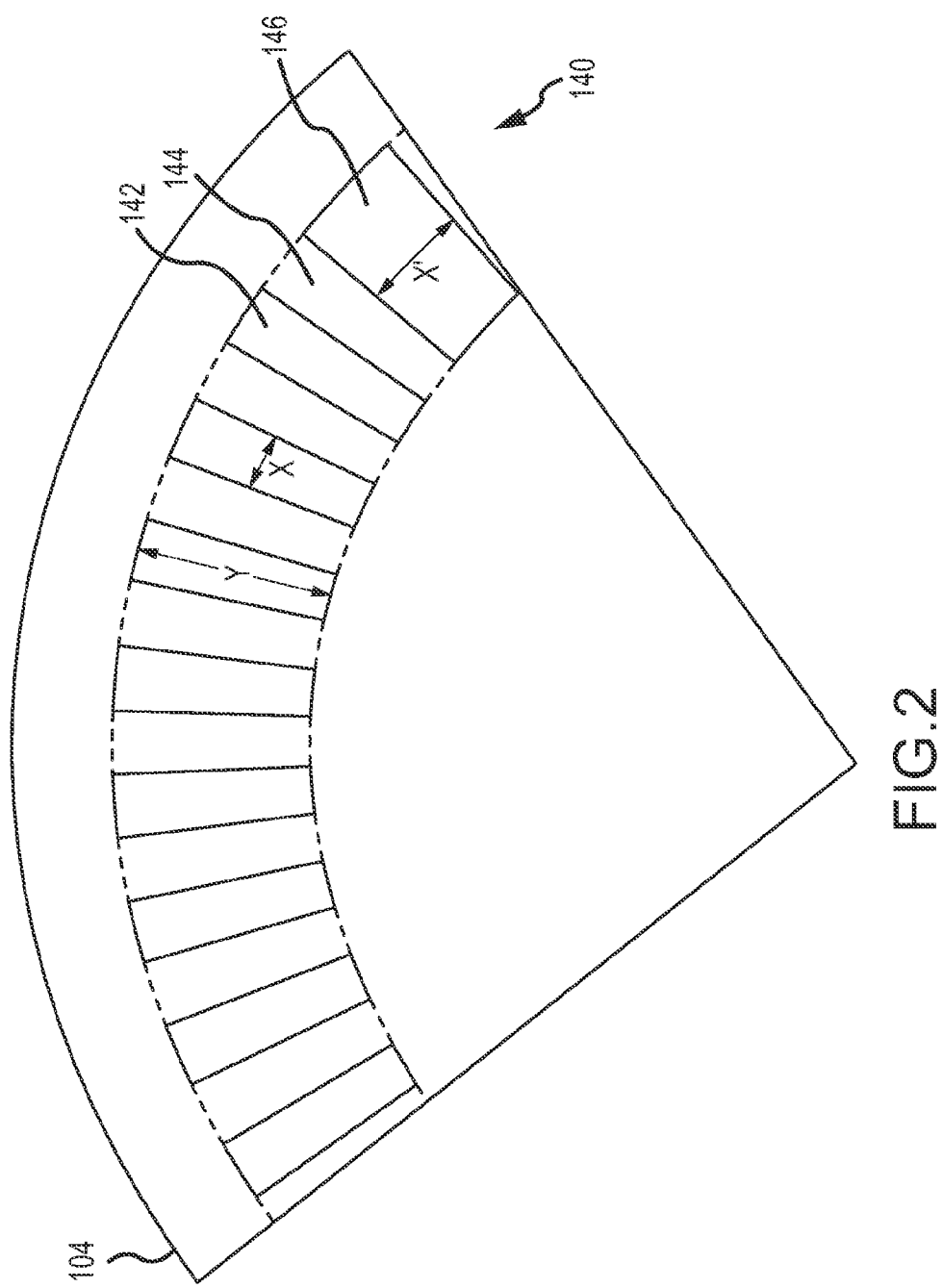
FIG. 2 is a partial schematic diagram of a code wheel in accordance with embodiments of the present disclosure.

Although a more detailed illustration of the code wheel 104 is provided in FIG. 2, a brief explanation is provided here as context for the operation of the reflective optical encoding system 100 shown in FIG. 1. In general, the code wheel 104 includes an optical track 140 of non-reflective sections 142

(which may also be referred to as bars 142) and reflective sections 144 (which may also be referred to as windows 144). The optical track 140 may further comprise an index section 146, which may also be non-reflective but is larger in area than the non-reflective sections 142.

An emitter 120 in the encoder 106 produces light that is incident on the code wheel track 140. As the code wheel 104 is rotated, for example by a motor shaft (not shown), the incident light is reflected by the reflective sections 142, 146 of the track 140, but is not reflected by the non-reflective sections 144 of the track 140. Thus, the light is reflected by the track 140 in a modulated pattern (i.e., on-off-on-off . . . etc.). A detector 130 in the encoder 106 detects the modulated, reflected light signal and, in response, generates one or more periodic channel signals (e.g., $CH_A$ and $CH_B$) as well as an index signal ($CH_I$) when the index section 146 passes over the encoder 106. In one embodiment, these channel signals and index signal are then transmitted to the decoder 108, which generates a count signal and potentially an index signal and transmits the generated signals to the microprocessor 110.

The microprocessor 110 uses the count signal to evaluate the incremental movement of, for example, the motor shaft or other moving part to which the code wheel 104 is coupled. The index signal is used to evaluate complete rotations of the motor shaft or moving part to which the code wheel 104 is coupled. Utilization of incremental signal outputs and an index output enables a more accurate optical encoding system 100 to be achieved.

In some embodiments, the encoder 106 includes the emitter 120 and the detector 130. The emitter 120 includes a light source 122 such as a light-emitting diode (LED). For convenience, the light source 122 is described herein as an LED, although other light sources, or multiple light sources, may be implemented. In one embodiment, the LED 122 is driven by a driver signal, $V_{LED}$, through a current-limiting resistor, $R_L$. The details of such driver circuits are well-known. Some embodiments of the emitter 120 also may include a lens 124 aligned with the LED 122 to direct the projected light in a particular path or pattern. For example, the lens 124 may focus the light onto the code wheel track 140.

In one embodiment, the detector 130 includes one or more photodetectors 132 such as photodiodes. The photodetectors may be implemented, for example, in an integrated circuit (IC). For convenience, the photodetectors 132 are described herein as photodiodes, although other types of photodetectors may be implemented. In one embodiment, the photodiodes 132 are uniquely configured to detect a specific pattern or wavelength of reflected light. Also, the photodiodes 132 may be arranged in a pattern that corresponds to the radius and design of the code wheel 104. The various patterns of photodiodes 132 are referred to herein as photodiode arrays.

The signals produced by the photodiodes 132 are processed by signal processing circuitry 134 which generates the channel signals, $CH_A$, $CH_B$, and $CH_I$. In one embodiment, the detector 130 also includes one or more comparators (not shown) to generate the channel signals and index signal. For example, analog signals from the photodiodes 132 may be converted by the comparators to transistor-transistor logic (TTL) compatible, digital output signals. In one embodiment, these output channel signals may indicate count and direction information for the modulated, reflected light signal. Additionally, the detector 130 may include a lens 136 to direct the reflected light signal toward the photodiodes 132.

Additional details of emitters, detectors, and optical encoders, generally, may be referenced in U.S. Pat. Nos. 4,451,731, 4,691,101, 5,241,172, and 7,400,269, all of which are hereby incorporated herein by reference in their entirety.

Furthermore, although embodiments of the present disclosure are particularly directed toward a reflective optical encoder, it should be appreciated that similar photodiode array and/or code wheel configurations can be utilized in a transmissive optical encoding system without departing from the scope of the present disclosure.

FIG. 2 depicts a partial schematic diagram of one embodiment of a code wheel 104. In particular, FIG. 2 illustrates a portion of a circular code wheel 104 in the shape of a disc. In some embodiments, the code wheel 104 may be in the shape of a ring, rather than a disc. The illustrated code wheel 104 includes a track 140, which may be a circular track that is concentric with the code wheel 104. In one embodiment, the track 140 includes a continuous repeating pattern of bars 142 and windows 144 that goes all the way around the code wheel 104 that is interrupted by a single index bar 146. The depicted pattern includes alternating bars 142 and windows 144, with an index bar 146 being located in the position where at least one bar 142 and window 144 would normally be positioned if a true alternating pattern of bars 142 and windows 144 were utilized. In some embodiments, the index bar 146 occupies at least the amount of space that would normally be occupied by two bars 142 and one window 144. In some embodiments, the index bar 146 occurs at least once around the codedisk. When the index bar 146 occurs more than once on a codedisk (or stripe), the encoder acts as a pseudo-absolute encoder.

The non-reflective sections 142 and reflective sections 144 can also referred to as position sections. In one embodiment, the non-reflective sections 142 are transparent sections of the code wheel 104 or, alternatively, are voids (e.g., holes) in the code wheel 104. The reflective sections 144 are, for example, opaque sections (which are reflective) in the code wheel 104. In one embodiment, the surface areas corresponding to the reflective sections 144 are coated with a reflective material. In another embodiment, similar to the implementation shown in FIG. 1, the reflective sections 144 of the code wheel 104 may be transparent, with a reflective coating 102 on the opposite side of the code wheel 104. In this embodiment, the non-reflective sections 142 may be opaque so that they absorb the light from the LED 122.

In some embodiments, a transmissive coding element is implemented instead of a reflective coding element. A transmissive coding element such as a code wheel or code strip includes a track 140 of transmissive and non-transmissive sections, rather than reflective and non-reflective sections 144 and 142. In one embodiment, the transmissive coding element is substantially similar to the reflective coding element, except that the transmissive coding element does not include a reflective material 102. In this way, the transparent sections 144 transmit light through the code wheel 104 and the opaque sections 142 do not transmit light through the code wheel 104.

Also, it should be noted that, in some embodiments, the circular code wheel 104 could be replaced with a coding element that is not circular. For example, a linear coding element such as a code strip 180 may be used. Also, an imaging coding element may be used in place of a reflective or transmissive coding element 104.

As described above, rotation of the code wheel 104 and, hence, the track 140 results in modulation of the reflected light signal at the detector 130 to measure position changes of the code wheel 104. Whereas prior art code wheels included a separate index track, embodiments of the present disclosure incorporate the index bar 146 in the optical track 140 to achieve a three-channel encoder that utilizes only a single track 140. This greatly reduces the size and complexity of the encoder 106.

In the embodiment depicted in FIG. 2, the position track sections 142 and 144 have the same circumferential dimensions (also referred to as the width dimension, as indicated by the span "X"). In other words, the intermediate non-reflective track sections 142 have the same width dimension as the reflective track sections 144. The resolution of the code wheel 104 is a function of the width dimensions of the position track sections 142 and 144. In one embodiment, the width dimensions of the non-reflective track sections 142 are a function of the amount of area required to produce a detectable gap between consecutive, reflected light pulses.

In some embodiments, the index bar 146 has a greater width dimension (as indicated by the span "X'") than the position tracks 142 and 144. In some embodiments, the index bar 146 has a width that is an integral multiple of the width of the position track sections 142 and 144. For example, the index bar 146 may have a width that is a multiple of 0.5 pitch (P) (e.g., 1.5 P, 2.5 P, 3.5 P, 4.5 P, etc.), where P corresponds to the width of a bar 142 or window 144. In other words, the width of the index bar 146 should be at least one and a half-times larger than "X" and it may be any integer value plus one and a half of "X". Other embodiments may implement different widths for the index bar 146. Additionally, although the depicted code wheel 104 includes a single index bar 146, embodiments of the present disclosure are not so limited. Moreover, although the index bar 146 is depicted as being embodied as a non-reflective section, it should be appreciated that the "index bar" 146 may actually be implemented as a window having dimensions similar to the index bar 146 described herein.

The height "Y" of the optical track 140 may be uniform or non-uniform across the entire code wheel 104. Accordingly, the height "Y" of each bar 142, window 144, and index bar 146 in the optical track 140 may be substantially the same and may be substantially aligned in the same optical track 140 such that the bars 142, windows 144, and index bar 146 all pass over the same photodiodes 132.

Figure 3:
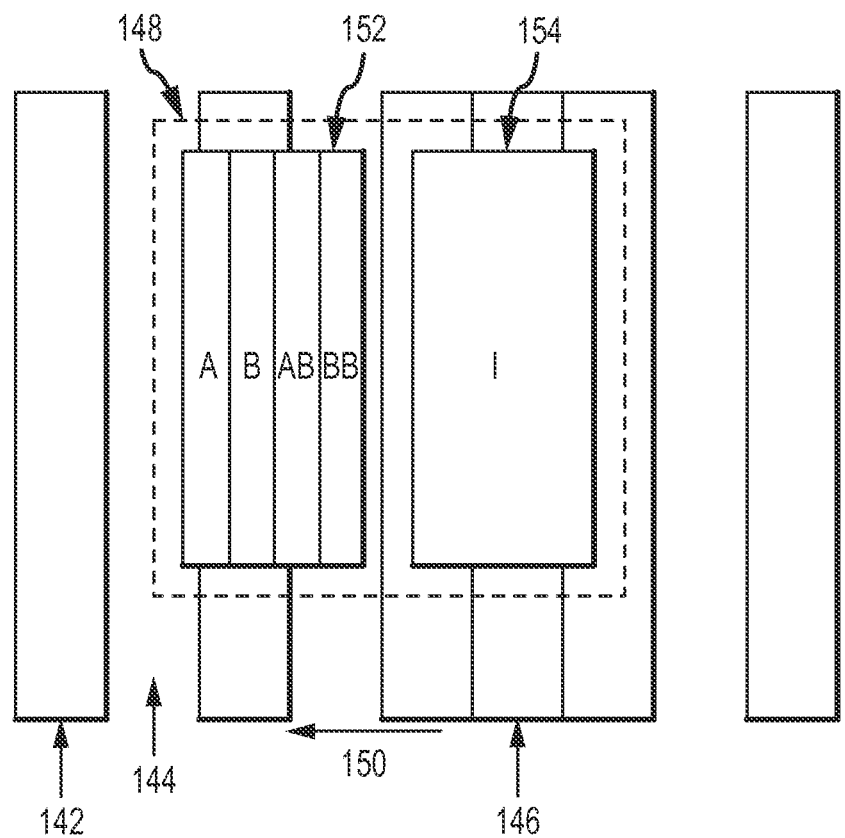
FIG. 3 is a first schematic layout of a photodiode array relative to the code wheel track in accordance with embodiments of the present disclosure.

FIG. 3 depicts a first configuration of photodiodes 132 in a sensor area 148 of the encoder 106. Specifically, FIG. 3 depicts a relatively simple implementation of a three-channel encoder using a single optical track 140. The sensor area 148 may be aligned relative to the optical track 140 such that the bars 142, windows 144, and index bar 146 all pass over the photodiodes 132 in the sensor area 148 as the code wheel 104 rotates in the direction of array 150 (or in the opposite direction).

The sensor area 148 may comprise an array of incremental photodiodes 152 and an index photodiode 154. Although the index photodiode 154 is depicted as a single photodiode which covers a certain area in the sensor area 148, one of ordinary skill in the art will appreciate that the index photodiode 154 may be implemented as an array of photodiodes. For ease of discussion, however, the index photodiode 154 will be referenced as a single photodiode although embodiments of the present disclosure are not so limited. The array of incremental photodiodes 152 are used to produce output signals $CH_A$ and $CH_B$ (or sine and cosine output signals) whereas the index photodiode 154 is used to produce output signal $CH_I$.

FIG. 3 also depicts a schematic layout of the sensor area 148 relative to the code wheel track 140. The A representation of the code wheel track 140 is overlaid with the sensor area 148 to depict possible dimensions of the individual photodiode array elements with respect to the sections of the code wheel track 140. Although the sensor area 148 corresponds to a circular code wheel track 140, other embodiments may implement a sensor area 148 and photodiode arrays 152, 154 arranged to align with a linear code strip track.

The illustrated array of incremental photodiodes 152 includes several individual photodiodes, including an A-signal photodiode to generate an A signal, a B-signal photodiode to generate a B signal, an AB-signal photodiode to generate an AB signal, and a BB-signal photodiode to generate a BB signal. For clarification, "AB" is read as "A bar" and "BB" is read as "B bar." This designation of the position photodiodes A, B, AB, and BB and the corresponding electrical signals that are generated by the position photodiodes is well-known in the art. The circumferential dimensions (also referred to as the width dimensions) of the position photodiodes A, B, AB, and BB are related to the width dimensions of the position track sections 142, 144, and 146 of the corresponding code wheel track 140. In the embodiment of FIG. 3, each photodiode A, B, AB, and BB in the array of incremental photodiodes 152 has a width that is one half the width of a bar or window 142 and 144 in the corresponding position track 140 (i.e., width of each photodiode equals "X/2").

Additionally, in the embodiment of FIG. 3, the width of the index photodiode 154 has a width that is twice the width of a bar or window 142 and 144. In other words, the width of the index photodiode 154 equals 2 times "X". This also means that the width of the index photodiode 154 is about four times the width of a single photodiode in the array of incremental photodiodes 152, but the overall width of the array of incremental photodiodes 152 is substantially equal to the width of the index photodiode 154.

Signals from photodiodes can be represented in current or in voltage domain and can be converted from one to the other. Also linear combinations of signals including scaling and summing or subtracting can be implemented. The present disclosure is not limited to any particular physical representation of those signals and, therefore, the signals are treated in an abstract way assuming that, independent on implementation, there exists a way to combine those signals in a linear way and to perform comparisons.

While the implementation of FIG. 3 achieves the goal of obtaining a three-channel encoder with a single optical track 140, a couple of implementation issues should be addressed.

Figure 4:
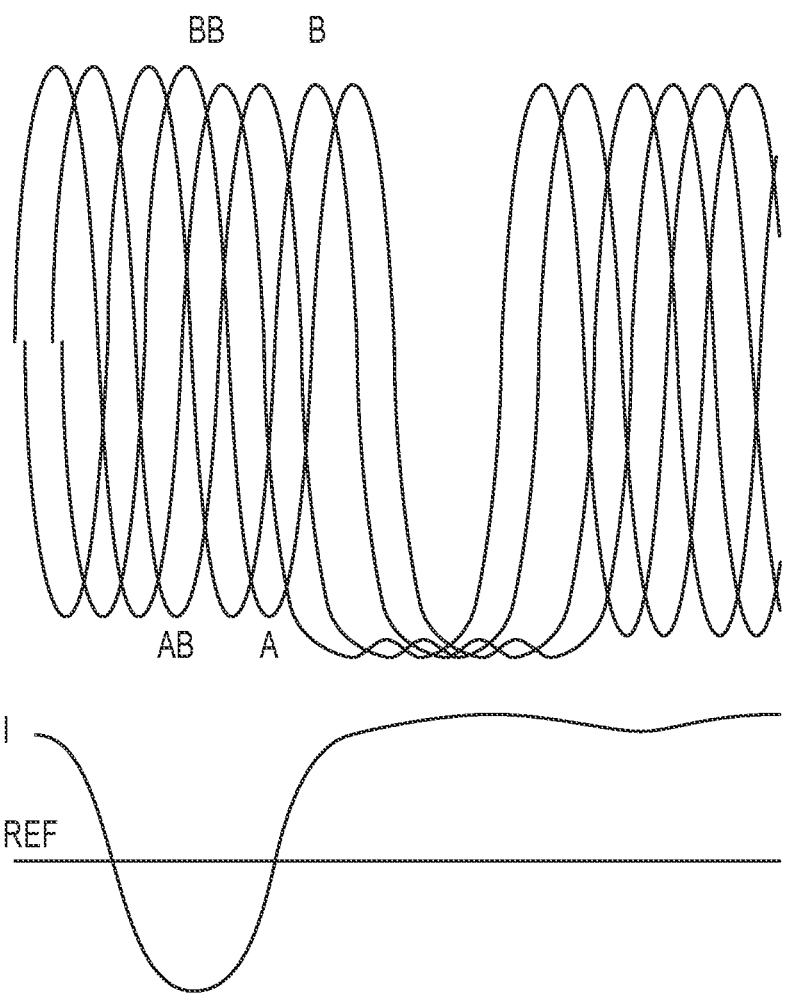
FIG. 4 depicts a wave diagram of analog output signals generated by the photodiode array of FIG. 3.

First, and as can be seen in FIG. 4, as the index bar 146 (or window) passes above photodiodes A, B, AB, and BB, the incremental signals generated therefrom are disturbed. More specifically, $CH_A$ and $CH_B$ may become distorted by passing the index bar 146 over the array of incremental photodiodes 152. This distortion may negatively impact the accuracy of angular position measured by the encoder Second, to generate a digital index pulse, a reference signal Ref is needed, so the sign of I-Ref can sensed by a comparator, whose output is the digital index pulse. The generation of Ref is not straightforward, after it is noticed that the signal from $CH_I$ may be significantly offset by stray-light and that its absolute amplitude is dependent on other parameters of the optical system 100 like strength of light source, optical gap, etc. Stray-light is a semi-uniform (not dependent on position of the code wheel) light projected on sensor area caused by imperfections of optical system.

Figure 5:
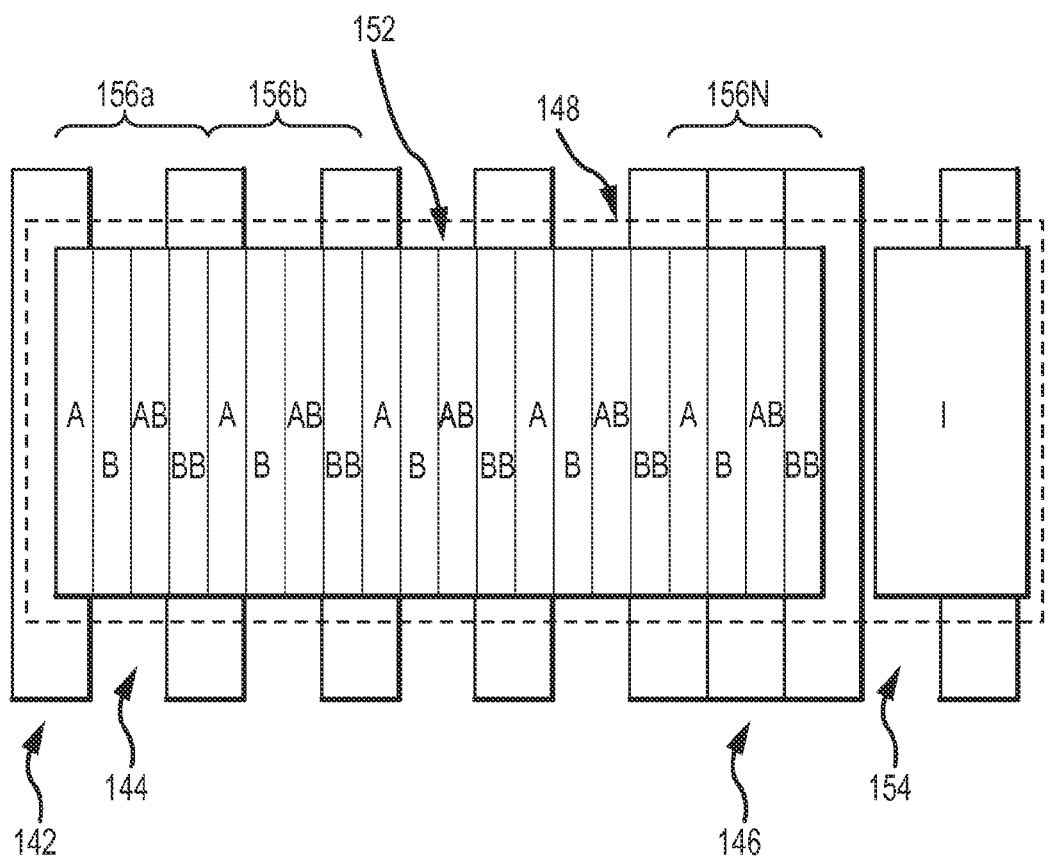
FIG. 5 is a second schematic layout of a photodiode array relative to the code wheel track in accordance with embodiments of the present disclosure.

Accordingly, one or more modifications to the sensor area 148 depicted in FIG. 3 may be implemented to reduce the amount of distortion caused by passing the index bar 146 over the array of incremental photodiodes 152. FIG. 5 depicts a first modification to the sensor area 148 that can reduce the distortion caused by the index bar 146. In particular, the array of incremental photodiodes 152 may be supplemented with a plurality of repeated A, B, AB, BB photodiode sections 156a-

N. Each photodiode section 156a-N may comprise an A photodiode, B photodiode, AB photodiode, and BB photodiode.

Figure 6:
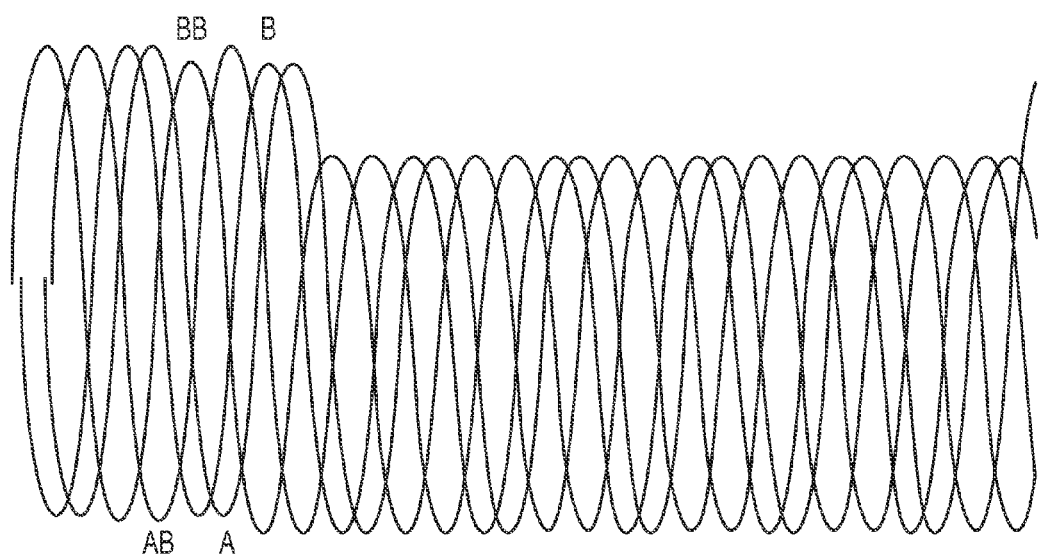
FIG. 6 depicts a wave diagram of analog output signals generated by the photodiode array of FIG. 5.

As can be seen in FIG. 6, if a relatively large number of sections (e.g., four or more) are incorporated into the array of incremental photodiodes 152, the distortion of signals $CH_A$ and $CH_B$ can be reduced significantly. However, the number of sections is constrained by the total width of the sensor area 148, by the required dimensions of the encoder 106, and by the ability of optical part of the encoder to accurately project the code wheel pattern over entire sensor area 148. Because of these constraints, using a multi-section array of incremental photodiodes 152 alone may not be sufficient to address the distortion issue caused by the index bar 146.

Accordingly, it may also be desirable to alter the shape of the photodiodes in the array of incremental photodiodes 152 thereby easing the transition of the index bar 146 as it passes over the array of incremental photodiodes 152. In some embodiments, the shape of the array of incremental photodiodes 152 may be altered to have a hexagonal outline that includes a middle portion 160 that is symmetrically surrounded by first and second transitional portions 158a, 158b, respectively.

It should be appreciated, however, that the first transitional portion 158a does not have to be a mirror opposite of the second transitional portion 158b. Rather, the size, contour, and/or number of photodiodes in the transitional portions 158a, 158b may be different in the first transitional portion 158a as compared to the second transitional portion 158b.

It should also be appreciated that while the first transitional portion 158a and second transitional portion 158b are depicted as having two sets of repeated A, B, AB, BB photodiode sections, a greater or lesser number of repeated A, B, AB, BB photodiode sections may be incorporated in the transitional portions 158a, 158b without departing from the scope of the present disclosure. Likewise, although the middle portion 160 is depicted as having only a single set of A, B, AB, BB photodiodes, the middle portion 160 may be configured to have a plurality of repeated A, B, AB, BB photodiode sections. Still further, the middle portion 160 and/or transitional portions 158a, 158b may not necessarily have full sets of A, B, AB, BB photodiodes. Rather, the middle portion 160 and/or transitional portions 158a, 158b may only have a subset of the A, B, AB, and BB photodiodes. As a non-limiting example, the first transitional portion 158a may only have A and B photodiodes whereas the second transitional portion 158b may only have AB and BB photodiodes.

Figure 7:
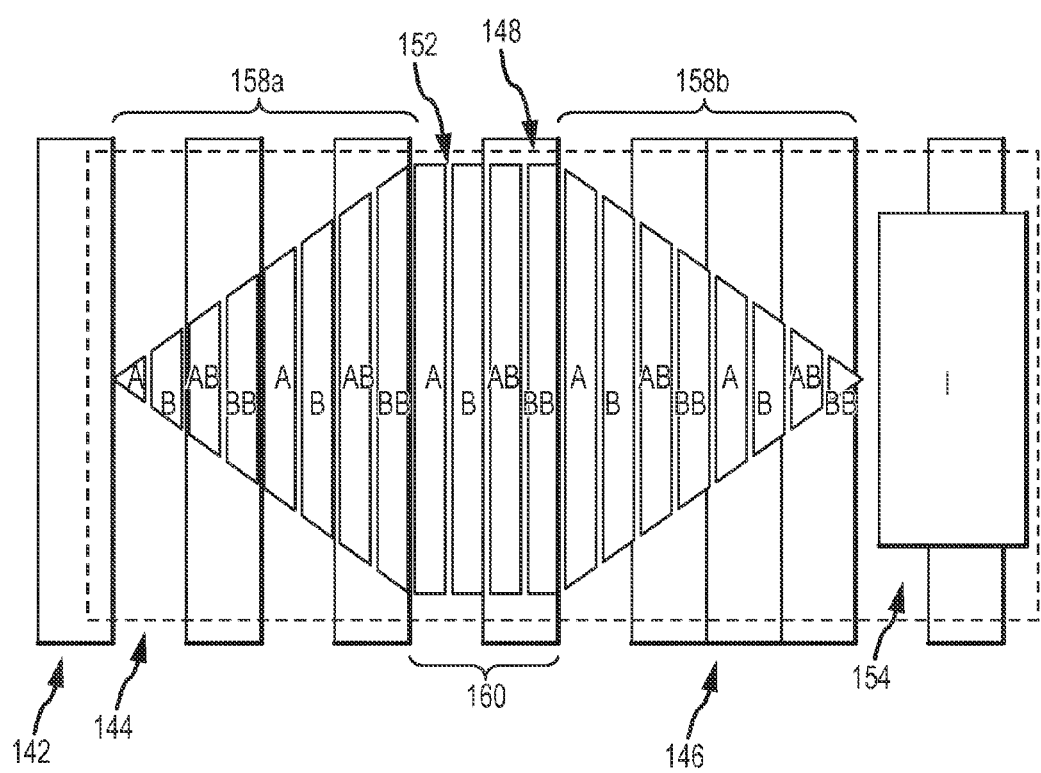
FIG. 7 is a third schematic layout of a photodiode array relative to the code wheel track in accordance with embodiments of the present disclosure.
Figure 8:
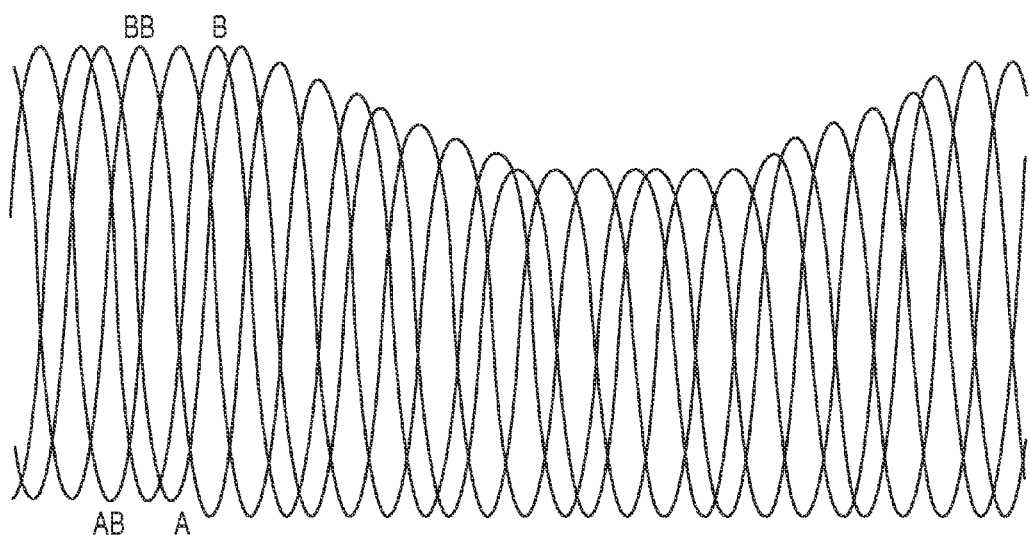
FIG. 8 depicts a wave diagram of analog output signals generated by the photodiode array of FIG. 7.

The modification depicted in FIG. 7 becomes evident after noticing that the core of the angular position measurement distortion comes from abrupt changes of signal amplitudes that do not happen at the same time. For example, if index bar 146 is approaching the array of incremental photodiodes 152 from the right hand side and is moving to the left, the index bar 146 first disturbs photodiode BB, then photodiode AB, then photodiode B, then photodiode A. This phenomenon is more clearly depicted in FIG. 8. The hexagonal outline presented makes the abruptness of the distortion caused by index bar 146 less as compared to the distortion depicted in FIG. 6.

Figure 9:
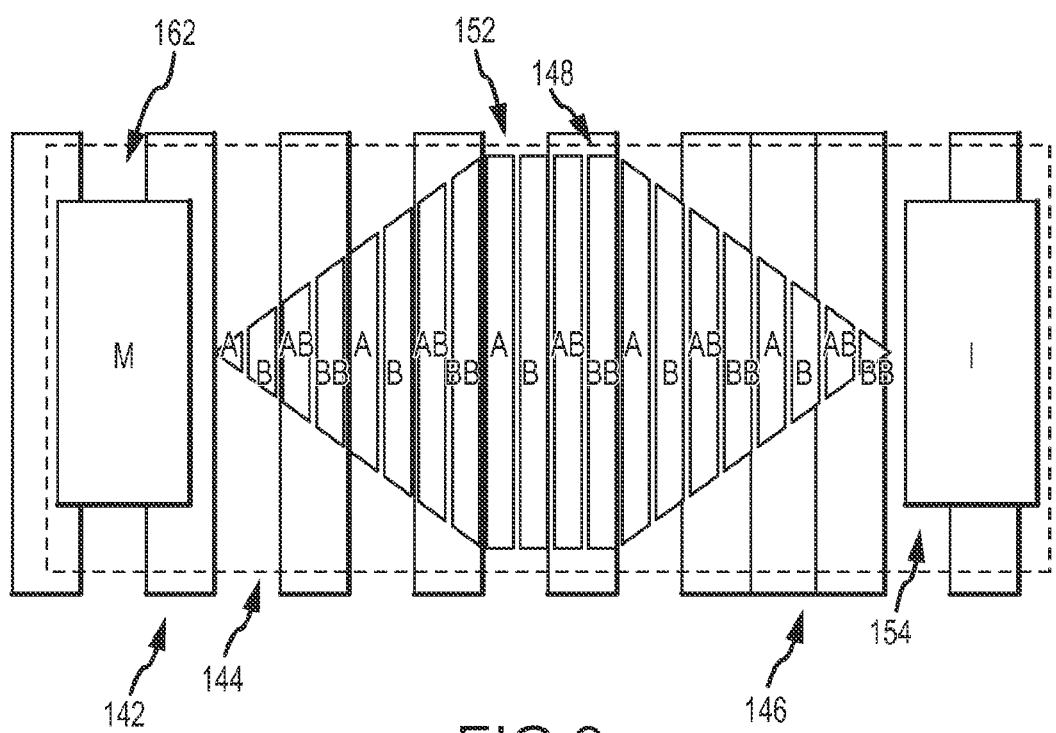
FIG. 9 is a fourth schematic layout of a photodiode array relative to the code wheel track in accordance with embodiments of the present disclosure.

FIG. 9 depicts another possible modification to the sensor area 148. In particular, the sensor area 148 may be altered to incorporate a replica index photodiode 162 on the opposite side of the array of incremental photodiodes 152 from the index photodiode 154. In other words, it may be desirable to surround the array of incremental photodiodes 152 with index photodiodes. The addition of the replica index photodiode 162 provides a solution to the stray-light problem discussed above. If the replica index photodiode 162 is located symmetrically about the array of incremental photodiodes 152 with respect to the index photodiode 154 and the stray-light intensity is also symmetrical relative to central vertical axis of the sensor area 148, the difference between the signal produced by the index photodiode 154 and the replica index photodiode 162 (i.e., I minus M) should be around zero, except when index bar 146 passes above either the index photodiode 154 or the replica index photodiode 162.

Figure 10:
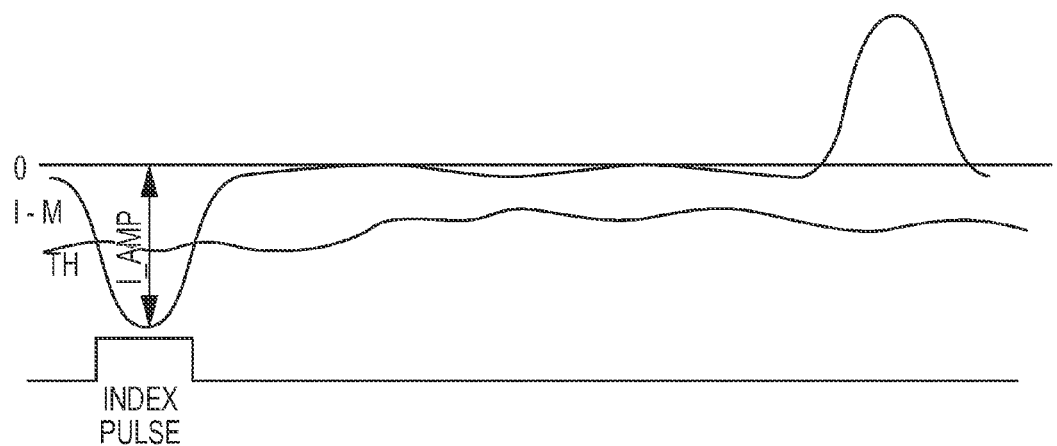
FIG. 10 depicts a wave diagram of a noramalized analog index output and its corresponding digital output generated by the photodiode array of FIG. 9.

As can be seen in FIG. 10, the value of I minus M is substantially zero (or at least normalized) unless the index bar 146 passes over one of the index photodiodes 154, 162. However, the passage of the index bar 146 over the index photodiode 154 can be differentiated from the passage of the index bar 146 over the replica index photodiode 162 because one event causes the value of I minus M to decrease dramatically (i.e., to a relatively large negative number) whereas the other event causes the value of I minus M to increase dramatically (i.e., to a relatively large positive number).

Accordingly, a threshold value TH can be computed and compared to the value of I minus M to generate the index pulse corresponding to a complete rotation of the code wheel 104 and not the occurrence of the index bar 146 passing over either index photodiode 154, 162.

Figure 11:
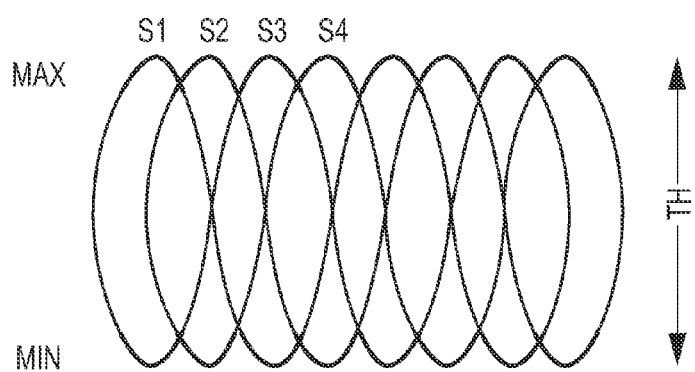
FIG. 11 depicts a wave diagram of analog output signals generated by the photodiode array of FIG. 9.

FIG. 11 shows one method of computing a useful threshold value TH for comparing to the difference between the outputs of the index photodiodes 154, 162. Regarding the threshold value TH, it should first be noticed that if TH is too small, a multiple index might occur or the Index pulse will be too big, while if TH is too big, it might result in no index. Therefore, the threshold value TH should ideally be around 0.5× amplitude of I (i.e., the amplitude of the signal output by index photodiode 154). To achieve this goal, the TH signal should scale proportionally to the amplitude of illumination of the sensor area 148. For that purpose A, B, AB, BB signals as well as interpolated signals (for example 0.7A+0.7B)—indicated as S1, S2, . . . , after passing through a maximum and minimum selector can be used as an indicator of light intensity.

More specifically, the design of maximum and minimum selectors can be simplified, when the following is noticed: if the encoder 106 generates digital signals based on A, B, AB, BB, and it's combinations used for interpolation, then those digital signals could be used to determine for every time point what signal (A, B, AB, BB or combination) must be chosen for maximum or minimum. In this way max/min selectors contain switches controlled by a combination of digital outputs of comparators. The threshold value TH can, therefore, be selected as the maximum of A, B, AB, and BB minus the minimum of A, B, AB, and BB. The value of I minus M can then be compared to the threshold value TH and if the value of I minus M is less than the threshold value TH, then a digital index output pulse can be generated. Otherwise, no digital index output pulse is generated.

As can be appreciated, the maximum and minimum selectors as well as the comparator functions may be performed in the signal processing circuitry 134 and/or the microprocessor 110. There is no requirement that any one of these components perform all of the processing steps involved with generating an index output as described herein.

Figure 12:
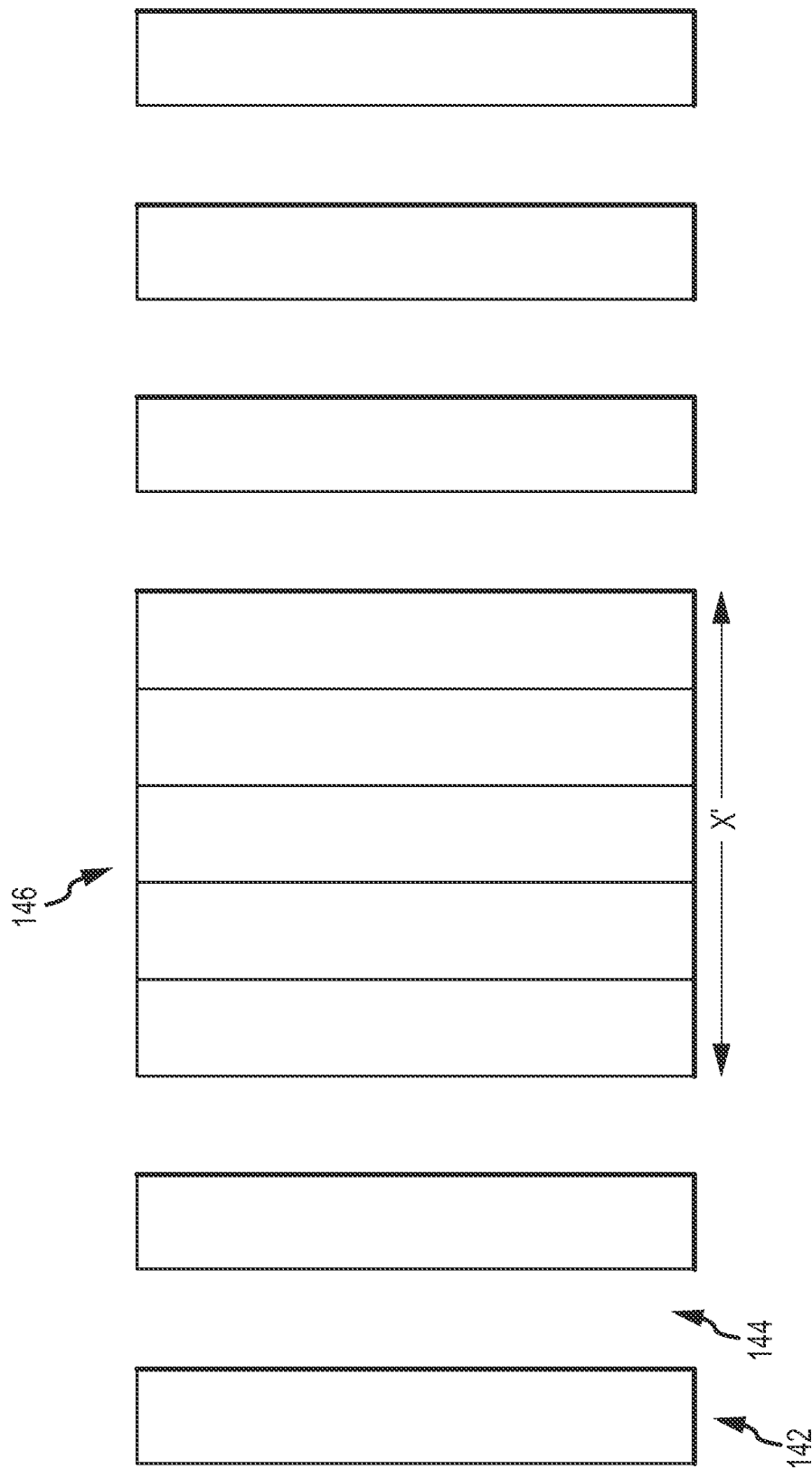
FIG. 12 depicts a first alternative code wheel track configuration in accordance with embodiments of the present disclosure.

With reference now to FIG. 12, a first alternative optical track 140 configuration will be described in accordance with at least some embodiments of the present disclosure. As discussed above, the dimensions of the index bar 146 may be altered without departing from the scope of the present disclosure. Here, the width "X" of the index bar 146 is about 2.5 P (i.e., 2.5× the width of a bar 142 or window 144)

Figure 13:
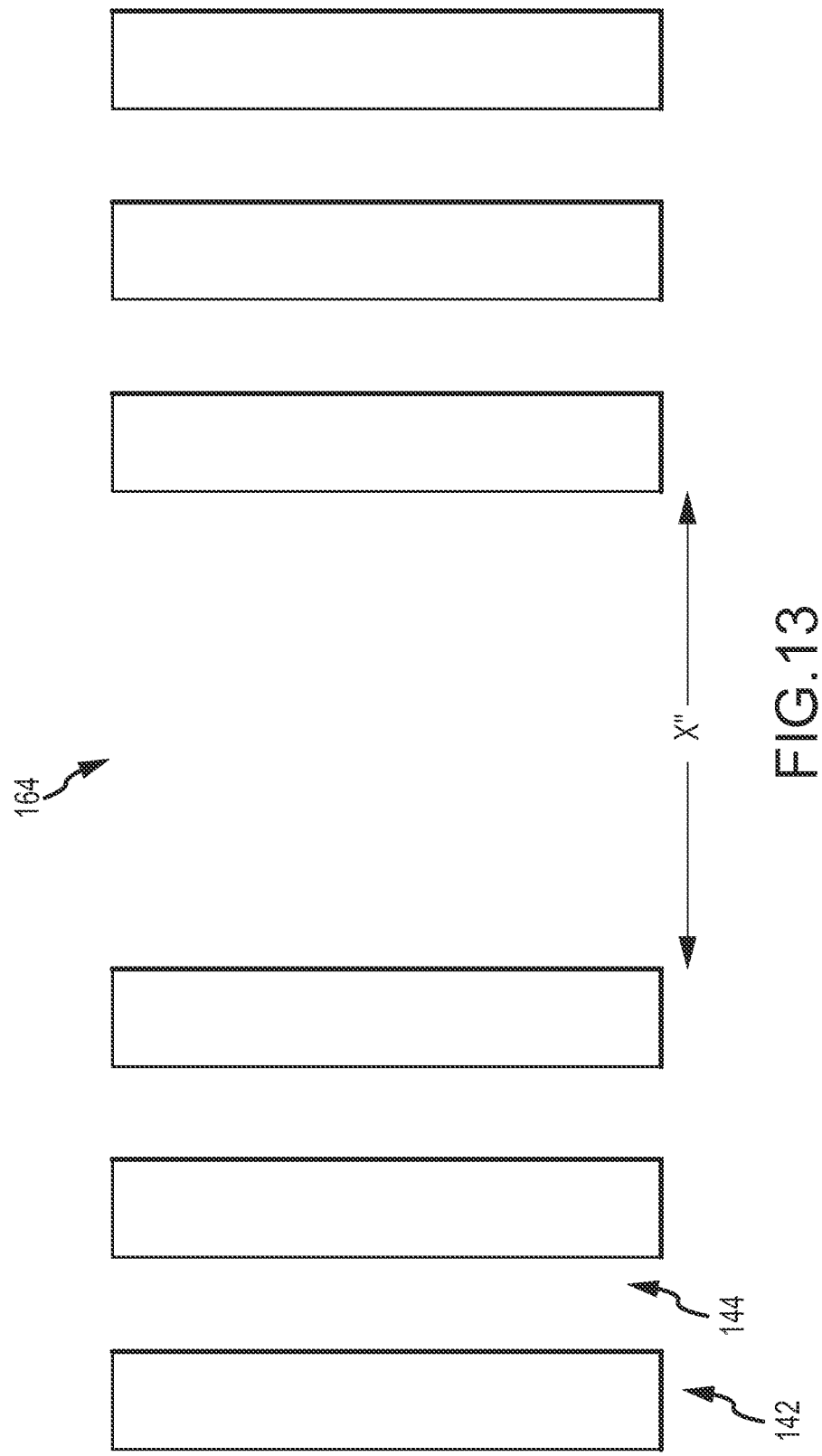
FIG. 13 depicts a second alternative code wheel track configuration in accordance with embodiments of the present disclosure.

FIG. 13 depicts a second alternative optical track 140 configuration in accordance with embodiments of the present disclosure. In particular, rather than using an extended bar as the index bar 146, an extended window 164 may be used to function as the index bar 146. Here, the passage of the extended window 164 over the sensor area 148 results is detected by one or both of the index photodiodes 154, 162 by the non-symmetrical absence of light detection. The extended window 164 may be sized similarly to the index bar 146 in that it may be any multiple of 0.5 P (e.g., 1.5 times "X", 2.5 times "X", 3.5 times "X", etc.).

It should also be appreciated that half sizes of the bars 142 and windows 144 do not have to be used for the index bar 146 or its equivalent. Rather, the index bar 146 (or an equivalent extended window 164) may be sized as any fraction of pitch (P) (e.g., 2.1 P, 1.2 P, etc.)

Figure 14:
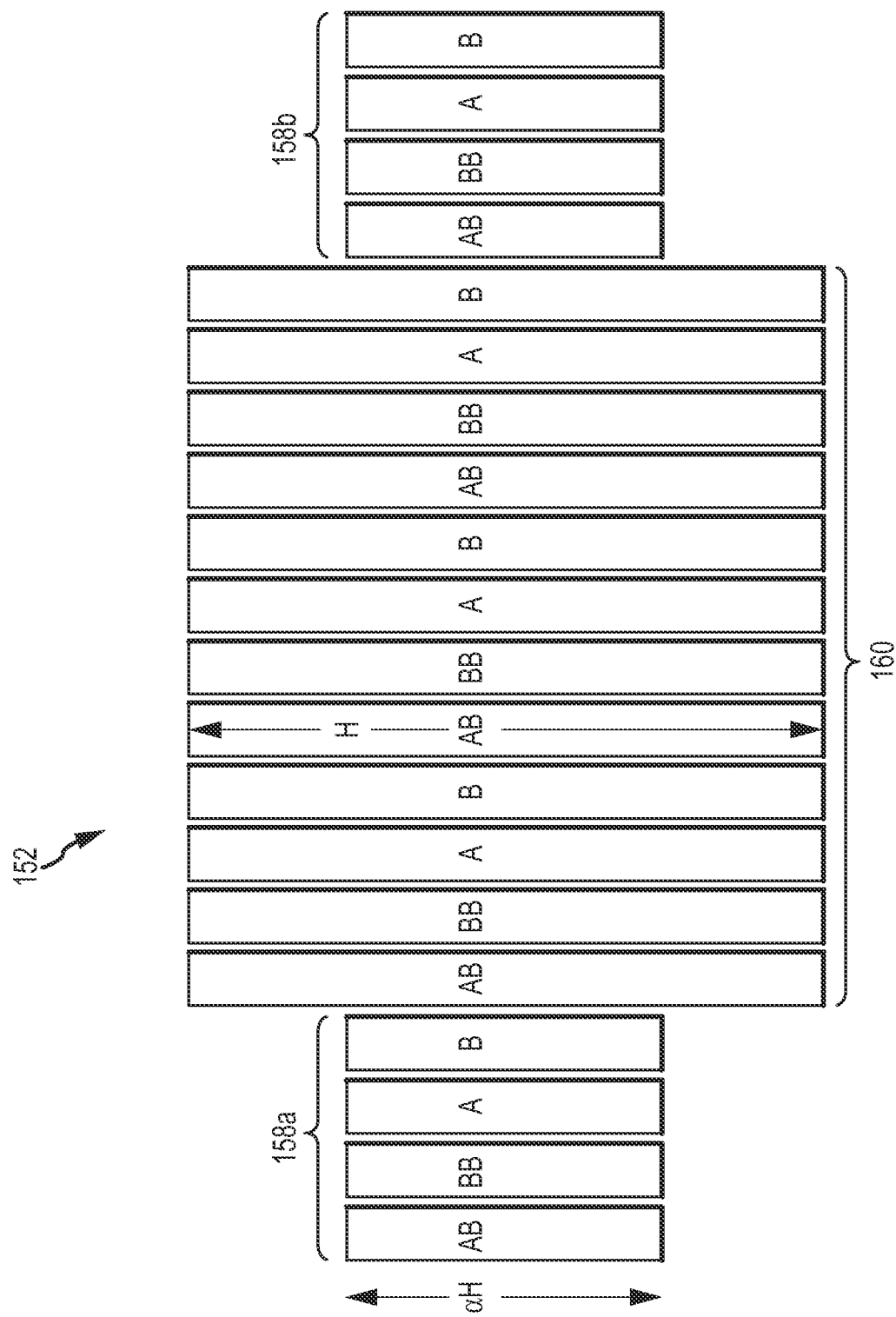
FIG. 14 depicts a first alternative photodiode array in accordance with embodiments of the present disclosure.

FIG. 14 depicts a first alternative configuration for the array of incremental photodiodes 152 in accordance with embodiments of the present disclosure. The first alternative configuration implements transitional portions 158a, 158b which are uniform in thickness instead of tapered. The middle portion 160 is also configured with a plurality of repeating A, B, AB, BB photodiode sections.

The largest thickness "H" of the array of incremental photodiodes 152 can be designed to minimize the interruption on incremental signal during an index transition. Moreover, the thickness of the transitional portions 158a, 158b may be a fractional height a of H. Suitable values for α include any value between zero and 1, non inclusive. As one example, the value of α may be equal to 0.5.

Figure 15:
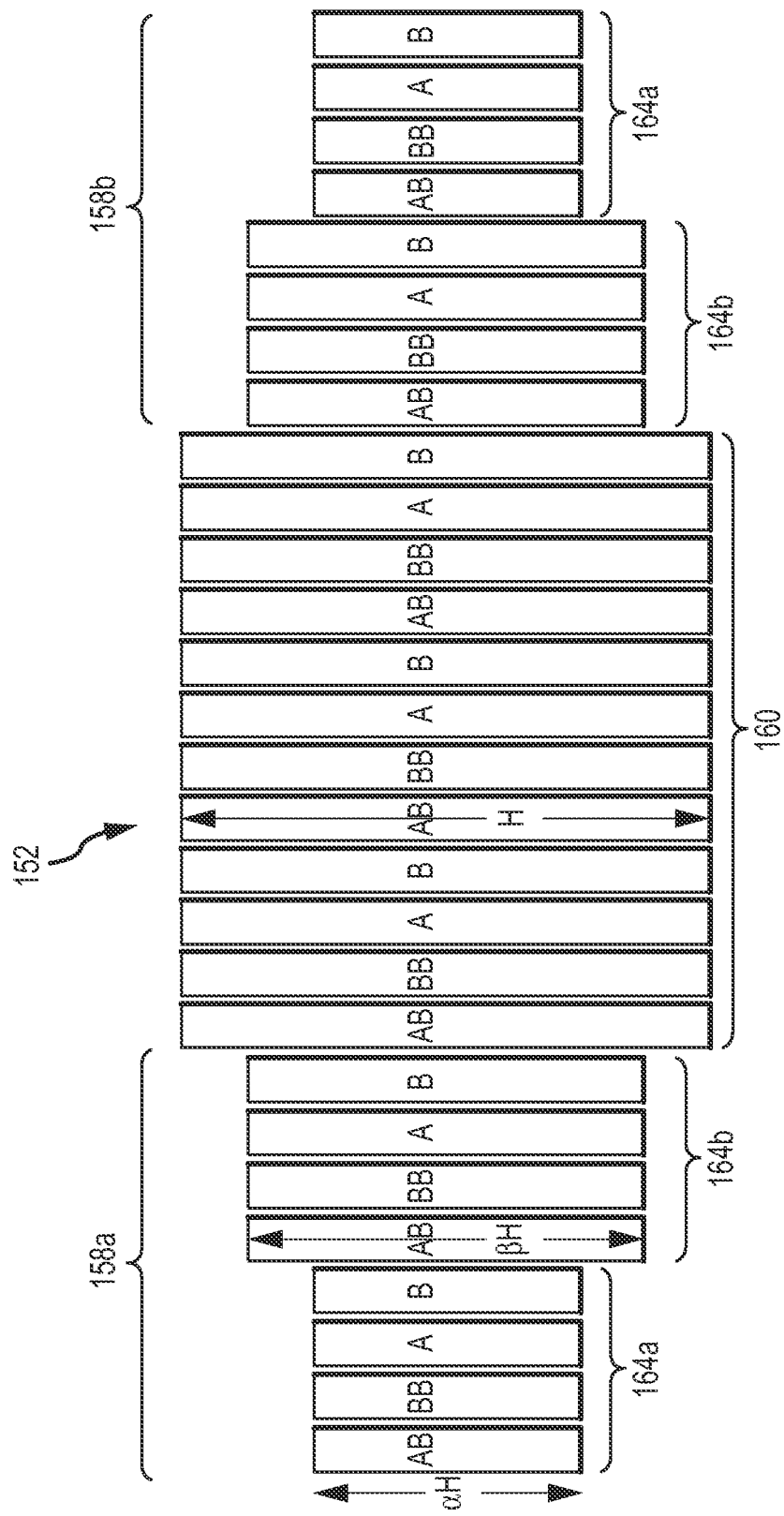
FIG. 15 depicts a second alternative photodiode array in accordance with embodiments of the present disclosure.

FIG. 15 depicts a second alternative configuration for the array of incremental photodiodes 152 in accordance with embodiments of the present disclosure. The second alternative configuration divides the transitional portions 158a, 158b into multiple segments 164a, 164b of different heights. Although only two segments 164a, 164b are depicted as being included in the transitional portions 158a, 158b, it should be appreciated that two, three, four, or more segments can be used. Each segment may comprise a full set of A, B, AB, and BB photodiodes, multiple sets of such photodiodes, or only a subset of these photodiodes. In some embodiments, the first segment 164a corresponds to the outermost part of the transitional portion, whereas the second segment 164b corresponds to the innermost part of the transitional portion. In some embodiments, the first segment 164a comprises a height that is a first fractional value α of "H" whereas the second segment 164b comprises a height that is a second fractional value β of "H". As one non-limiting example, the first fractional value α may equal 0.5 and the second fractional value β may equal 0.75.

Another possible configuration, although not depicted, may completely eliminate the middle portion 160. Rather, the array of incremental photodiodes 152 may only comprise transitional portions 158a, 158b.

Figure 16:
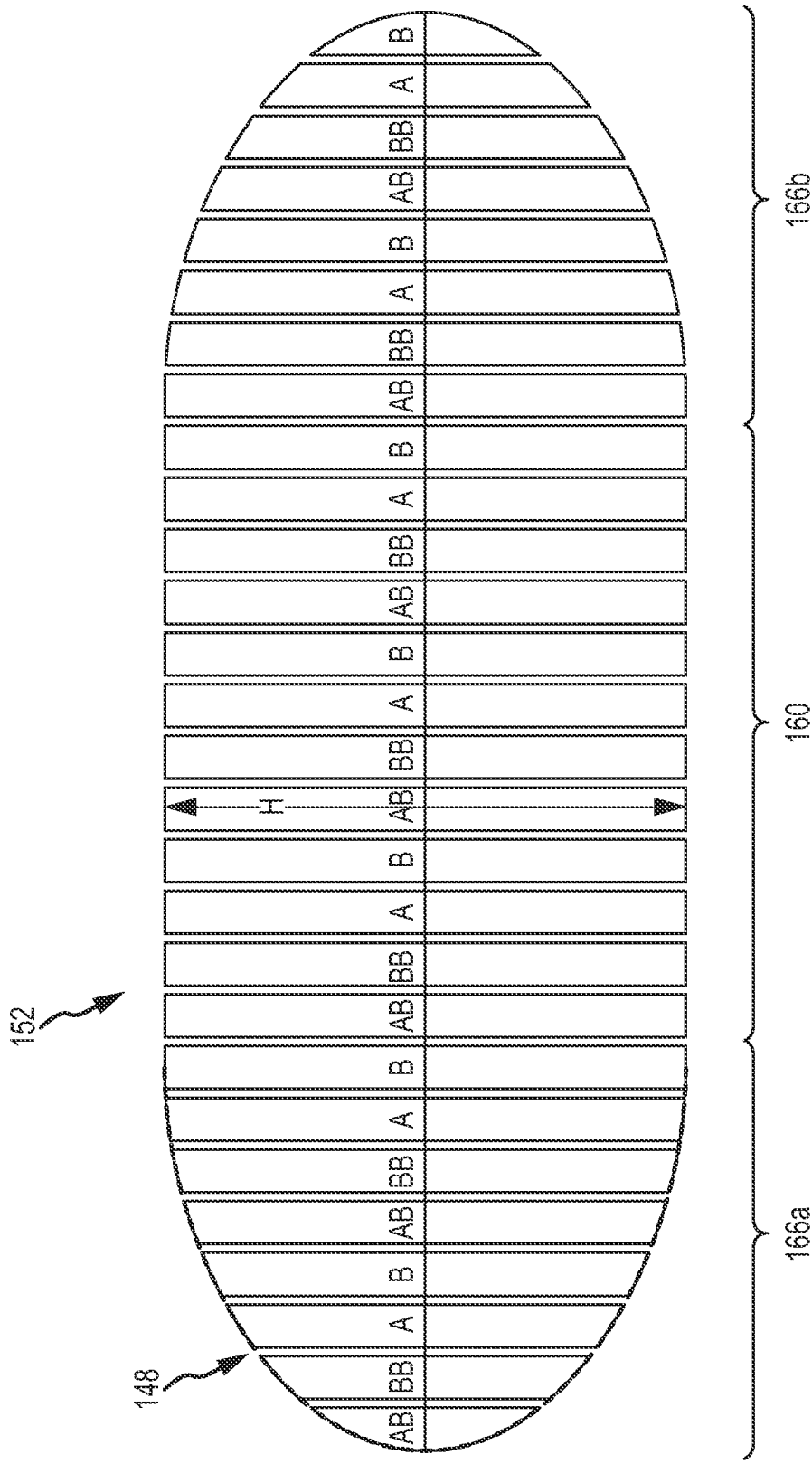
FIG. 16 depicts a third alternative photodiode array in accordance with embodiments of the present disclosure.
Figure 17:
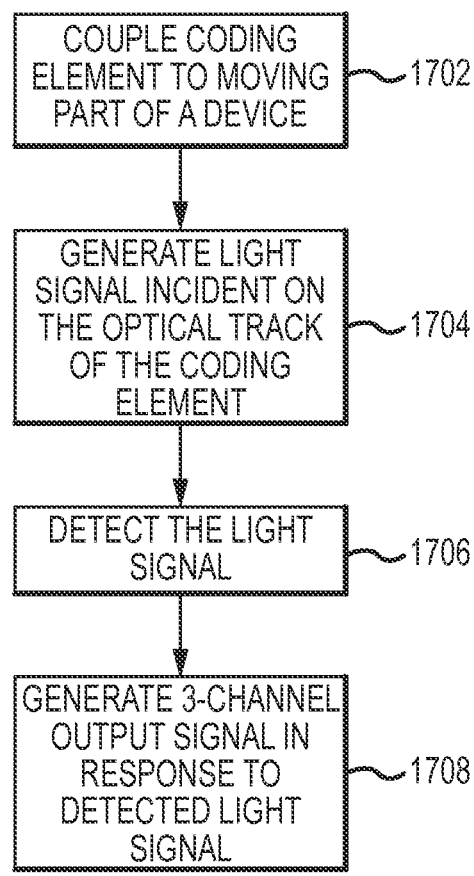
FIG. 17 is a flow diagram depicting a method of operating a three-channel encoder in accordance with embodiments of the present disclosure.

With reference now to FIG. 16, another alternative configuration for the array of incremental photodiodes 152 will be described in accordance with at least some embodiments of the present disclosure. Here, the transitional portions are replaced with first and second curved transitional portions 166a, 166b, respectively. The profile of the transitional portions 166a, 166b follows a polynomial line or curve as opposed to the linear profile depicted in FIG. 9. Additionally, the curved transitional portions 166a, 166b comprise two sets of A, B, AB, and BB photodiodes and the middle portion 160 comprises three sets of A, B, AB, and BB photodiodes. Again, the number of A, B, AB, and BB photodiodes in each portion of the array of incremental photodiodes 152 can vary without departing from the scope of the present disclosure.

While a number of potential modifications to the optical track 140 and sensor area 148 have been discussed herein, it should be appreciate that combinations of the potential modifications can also be implemented without departing from the scope of the present disclosure. Therefore, any optical encoding system 100 incorporating one or more of the features of the optical track 140 and/or sensor area 148 described herein falls within the scope of the present disclosure.

Additionally, the dimensions of the sensor area 148 and the photodiodes therein may vary depending upon the application in which the optical encoder system 100 is employed. As one non-limiting example, the height of the sensor area 148 may be on the order of about 300 to 400 micrometers. The length of the sensor area 148 can be on the order of about 1200 micrometers. The width of each A, B, AB, and BB photodiode may be on the order of about 40 micrometers. The width of the index photodiode 154 or replica index photodiode 162 may be on the order of about 160 micrometers. As can be appreciated, however, the sizes of the components described herein can vary to accommodate any number of applications.

Specific details were given in the description to provide a thorough understanding of the embodiments. However, it will be understood by one of ordinary skill in the art that the embodiments may be practiced without these specific details. For example, circuits may be shown in block diagrams in order not to obscure the embodiments in unnecessary detail. In other instances, well-known circuits, processes, algorithms, structures, and techniques may be shown without unnecessary detail in order to avoid obscuring the embodiments.

While illustrative embodiments of the disclosure have been described in detail herein, it is to be understood that the inventive concepts may be otherwise variously embodied and employed, and that the appended claims are intended to be construed to include such variations, except as limited by the prior art.

What is claimed is:

1. An encoder for use in an optical encoding system, comprising:
    an emitter configured to emit light;
    a detector configured to receive at least a portion of the light emitted by the emitter and convert the received light into one or more electrical signals which are used to generate three output channels, wherein the light used to generate the three output channels at least one of passed through and was reflected by a single optical track, wherein the detector comprises a sensor area that includes an array of incremental photodiodes and an index photodiode, wherein the array of incremental photodiodes comprises a first transitional portion that includes at least one photodiode of a first height, a second transitional portion that includes at least one photodiode of the first height, and a middle portion positioned between the first and second transitional portions, the middle portion including at least one photodiode of a second height that is larger than the first height, and wherein at least one of the first and second transitional portions is closer to the index photodiode than the middle portion.

2. The encoder of claim 1, wherein the sensor area further includes a replica index photodiode.

3. The encoder of claim 2, wherein the array of incremental photodiodes is positioned between the index photodiode and the replica index photodiode.

4. The encoder of claim 1, wherein the index photodiode is about four times as wide as a single photodiode in the array of incremental photodiodes.

5. The encoder of claim 1, wherein the three output channels include a first and second channel used to determine incremental angular position and a third channel used to determine absolute angular position, wherein the array of incremental photodiodes produce the electrical signals used to generate the first and second channel outputs, and wherein the index photodiode produces the electrical signal used to generate the third channel output.

6. The encoder of claim 1, wherein the detector comprises a sensor area that includes an array of incremental photodiodes configured in a hexagonal outline.

7. The encoder of claim 1, wherein the emitter comprises an LED.

8. The encoder of claim 1, wherein the single optical track is provided on a coding element having a track with a track pattern, the track pattern comprising a plurality of optically distinguishable sections, and wherein the plurality of optically distinguishable sections comprises at least one of an index bar and an extended window.

9. A system for translating physical motion of a device into an electrical signal, the system comprising:
an encoder comprising a sensor area that includes an array of incremental photodiodes and an index photodiode, the sensor area configured to be positioned proximate to a single optical track of a coding element that is mechanically coupled to the device, wherein the array of incremental photodiodes are used to generate electrical signals which can be used to determine an incremental position of the coding element, and wherein the index photodiode is used to generate an electrical signal which can be used to determine a homing position of the coding element, wherein the array of incremental photodiodes comprise a first and second transitional portion separated by a middle portion, and wherein at least one of the first transitional portion and second transitional portion is closer to the index photodiode than the middle portion.

10. The system of claim 9, wherein the first and second transitional portions are linearly tapered.

11. The system of claim 9, wherein the first and second transitional portions are curved.

12. The system of claim 9, further comprising signal processing circuitry configured to convert electrical signals received from the array of incremental photodiodes into signals which are output at first and second channels and wherein the signal processing circuitry is further configured to convert electrical signals received from the index photodiode into a signal which is output at a third channel.

13. The system of claim 12, wherein the first and second channels are used to determine the incremental position of the coding element and wherein the third channel is used to determine the homing position of the coding element.

14. The system of claim 12, wherein the sensor area further includes a replica index photodiode, wherein the electrical signal received from the index photodiode is subtracted from the electrical signal received from the replica index photodiode and compared to a threshold value that is determined based on the signals received from the array of incremental photodiodes, and wherein the comparison to the threshold value is used to determine whether to generate an index pulse.

15. An optical encoding system, comprising:
a coding element having a track with a track pattern, the track pattern comprising a plurality of repeating optically distinguishable sections interrupted by an absolute position indicator;
an emitter configured to generate a light signal incident on the track of the coding element; and
a detector comprising an optical sensor area having a plurality of photodiodes positioned to detect the light signal from the emitter, wherein the plurality of photodiodes includes an array of incremental photodiodes and at least one index photodiode, wherein the at least one index photodiode comprises an index photodiode and a replica index photodiode, wherein the index photodiode generates a first index output signal, wherein the replica index photodiode generates a second index output signal, wherein a difference between the first index output signal and the second index output signal is compared to a threshold value to determine whether to generate an index pulse.

16. The system of claim 15, wherein the plurality of repeating optically distinguishable sections comprises alternating reflective and non-reflective sections interrupted by at least one of an extended reflective section and an extended non-reflective section.

17. An optical encoding system, comprising:
a coding element having a track with a track pattern, the track pattern comprising a plurality of repeating optically distinguishable sections interrupted by an absolute position indicator;
an emitter configured to generate a light signal incident on the track of the coding element; and
a detector comprising an optical sensor area having a plurality of photodiodes positioned to detect the light signal from the emittter, wherein the plurality of photodiodes includes an array of incremental photodiodes and at least one index photodiode, wherein the at least one index photodiode comprises an index photodiode and a replica index photodiode, wherein the index photodiode generates a first index output signal, wherein the replica index phototdiode generates a second index output signal, wherein a difference between the first index output signal and the second index output signal is compared to a threshold value to determine whether to generate an index pulse, wherein the threshold value is calculated by determining a maximum and minimum intensity of signals produced by the array of incremental photodiodes.

* * * * *